US009362908B2

(12) United States Patent
Ota

(10) Patent No.: US 9,362,908 B2
(45) Date of Patent: Jun. 7, 2016

(54) SEMICONDUCTOR APPARATUS INCLUDING OUTPUT BUFFER

(71) Applicant: Micron Technology, Inc., Boise, ID (US)

(72) Inventor: Ken Ota, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/629,127

(22) Filed: Feb. 23, 2015

(65) Prior Publication Data

US 2015/0256175 A1 Sep. 10, 2015

(30) Foreign Application Priority Data

Mar. 5, 2014 (JP) ................................. 2014-043172

(51) Int. Cl.
| | |
|---|---|
| *H01L 27/00* | (2006.01) |
| *H03K 19/00* | (2006.01) |
| *H01L 27/088* | (2006.01) |
| *H01L 29/08* | (2006.01) |
| *H01L 29/78* | (2006.01) |
| *H01L 27/02* | (2006.01) |
| *H01L 27/092* | (2006.01) |

(52) U.S. Cl.
CPC ........ *H03K 19/0005* (2013.01); *H01L 27/0207* (2013.01); *H01L 27/0266* (2013.01); *H01L 27/088* (2013.01); *H01L 29/0847* (2013.01); *H01L 29/7827* (2013.01); *H01L 27/092* (2013.01)

(58) Field of Classification Search
CPC . H01L 27/00; H01L 27/0207; H01L 27/0266; H01L 27/088; H01L 29/0847; H01L 29/7827; H03K 19/0005
USPC ......... 327/100, 108, 109, 306, 564, 565, 566; 326/62, 82, 83, 87
See application file for complete search history.

(56) References Cited

U.S. PATENT DOCUMENTS

| | | | | |
|---|---|---|---|---|
| 2010/0019835 | A1* | 1/2010 | Arisaka ................. | G11C 16/30 327/541 |
| 2011/0062984 | A1* | 3/2011 | Kuwahara ............ | G11C 7/1051 326/30 |
| 2015/0035054 | A1* | 2/2015 | Nishizaki ......... | H01L 29/42376 257/338 |

FOREIGN PATENT DOCUMENTS

JP 2011-061580 3/2011

* cited by examiner

*Primary Examiner* — William Hernandez
(74) *Attorney, Agent, or Firm* — Dorsey & Whitney LLP

(57) ABSTRACT

An output circuit includes first, second and third transistors. The first transistor includes first and second diffusion layers. The third transistor includes third and fourth diffusion layers. The first transistor shares the second diffusion layer with the second transistor and the third transistor shares the third diffusion layer with the second transistor. The second transistor is rendered conductive responsive to an activation of a first signal and non-conductive responsive to an inactivation of the first signal. The first and third transistors are rendered conductive responsive to an activation of a second signal that is different from the first signal and rendered non-conductive responsive to an in activation of the second signal.

20 Claims, 18 Drawing Sheets

SEMICONDUCTOR APPARATUS INCLUDING OUTPUT BUFFER

PRIORITY

This application is based upon and claims the benefit of priority from Japanese Patent Application No. 2014-043172 filed on Mar. 5, 2014, the disclosure of which are incorporated herein in its entirely by reference.

TECHNICAL FIELD

Embodiments of the present invention relate generally to an output circuit of a semiconductor device, more specifically, an impedance adjustable output circuit of a semiconductor device.

BACKGROUND

A calibration circuit is provided in certain semiconductor devices in order to adjust the impedance of an output buffer resulting in adjusting the impedance of an output terminal. Japanese Patent Application Laid-Open No. 2011-61580 shows an example of such a calibration circuit. The output buffer includes multiple transistors coupled in parallel, and its impedance is adjusted by specifying the number of transistors to be activated through a selection signal generated by the calibration circuit.

For example, when five transistors that are binary-weighted are coupled in parallel, 32 stages of impedance adjustment can be performed, which include a stage of deactivating all the transistors and a stage of activating all the transistors. However, because the lengths of respective interconnects between the transistors and the output terminal are different from one another, selection of a transistor results in a change in the interconnect resistance.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well known circuits, control signals, timing protocols, and software operations have not been shown in detail in order to avoid unnecessarily obscuring the invention.

Figure 1:
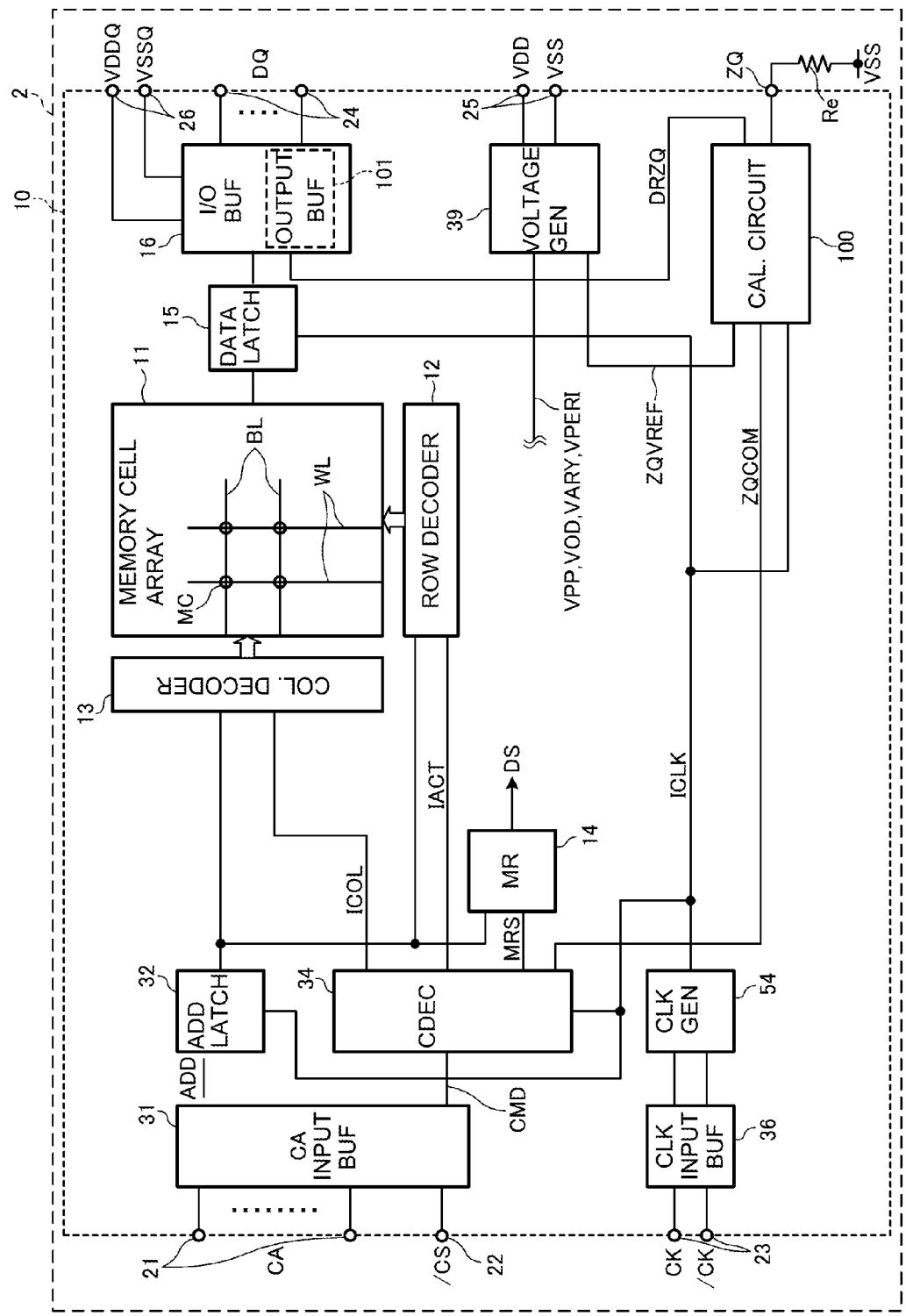
FIG. 1 is a functional block diagram of a semiconductor device according to an embodiment of the present invention.

FIG. 1 is a functional block diagram of a semiconductor device 10 according to a first embodiment of the present invention.

The semiconductor device 10 of the first embodiment is a DRAM (Dynamic Random Access Memory) integrated into a single semiconductor chip and is mounted on an external board 2. The external board 2 is a printed circuit board, such as a mother board, module board, and package board, and includes an external resistance Re, which has one end coupled to a calibration terminal ZQ of the semiconductor device 10. In the first embodiment, the external resistance Re has a resistance value of, for example, 240Ω. A ground voltage VSS is supplied to the other end of the external resistance Re.

The semiconductor device 10 includes a memory cell array 11, which has multiple word lines WL, multiple bit lines BL, and memory cells MC disposed at the intersections of the word lines WL and bit lines BL. A word line WL is selected by a row decoder 12, while a bit line BL is selected by a column decoder 13. The semiconductor device 10 also includes clock terminals 23, command address terminals 21, a chip select terminal 22, data terminals 24, power supply terminals 25 and 26, and the calibration terminal ZQ, which serve as external terminals of the semiconductor device 10.

External clock signals CK and /CK input to a clock input circuit 36 are supplied to a clock generating circuit 54. Based on the external clock signals CK and /CK, the clock generating circuit 54 generates an internal clock signal ICLK.

In synchronization with the internal clock ICLK, an address latching circuit 32 latches an address signal ADD. A row address indicated by the latched address signal ADD is supplied to the row decoder 12, while a column address indicated by the latched address signal ADD is supplied to the column decoder 13. When the semiconductor device 10 enters into a mode register set, the address signal ADD is supplied as a mode setting signal to a mode register 14. Parameters indicative of operation modes of the semiconductor device 10 are set in the mode register 14. In FIG. 1, a drive capability signal DS is shown, which is one of operation mode parameters indicated by the mode register. The drive capability signal DS specifies the number of unitary buffers to be activated when data is output, out of multiple unitary buffers in an input/output circuit 16. The drive capability signal DS will be described in detail later.

A command decoding circuit 34 holds, decodes, and counts command signals CMD in synchronization with the internal clock ICLK, and generates various internal commands, which include an active signal IACT, a column signal ICOL, a mode register set signal MRS, and a calibration signal ZQCOM.

The calibration signal ZQCOM is activated when the command signal CMD indicates a calibration command. The calibration command is issued when the semiconductor device 10 is initialized and is also issued regularly when the semiconductor device 10 is in normal operation. The calibration signal ZQCOM activates the calibration circuit 100. In response to the calibration signal ZQCOM, the calibration circuit 100 executes a calibration operation in synchronization with the internal clock ICLK, and adjusts the impedance of an output circuit 101 included in the input/output circuit 16. The details of the output circuit 101 will be described later.

The power supply terminals 25 are supplied with source voltages VDD and VSS, which are supplied to an internal power generating circuit 39 via the power supply terminals 25. Based on the source voltages VDD and VSS, the internal power generating circuit 39 generates various internal voltages VPP, VOD, VARY, and VPERI.

The power supply terminals 26 are supplied with source voltages VDDQ and VSSQ, which are supplied to the input/output circuit 16, where the source voltages VDDQ and VSSQ are used as operating voltages for the output circuit 101 included in the input/output circuit 16. The source voltage VDDQ is identical in potential with the source voltage VDD, and the source voltage VSSQ is identical in potential with the source voltage VSS. However, the power supply route for the source voltages VDDQ and VSSQ is separated from the power supply route for the source voltages VDD and VSS lest power noises generated by the operation of the output circuit 101 should propagate to other circuits. According to the present invention, however, such power supply route separation is not essential.

Figure 2:
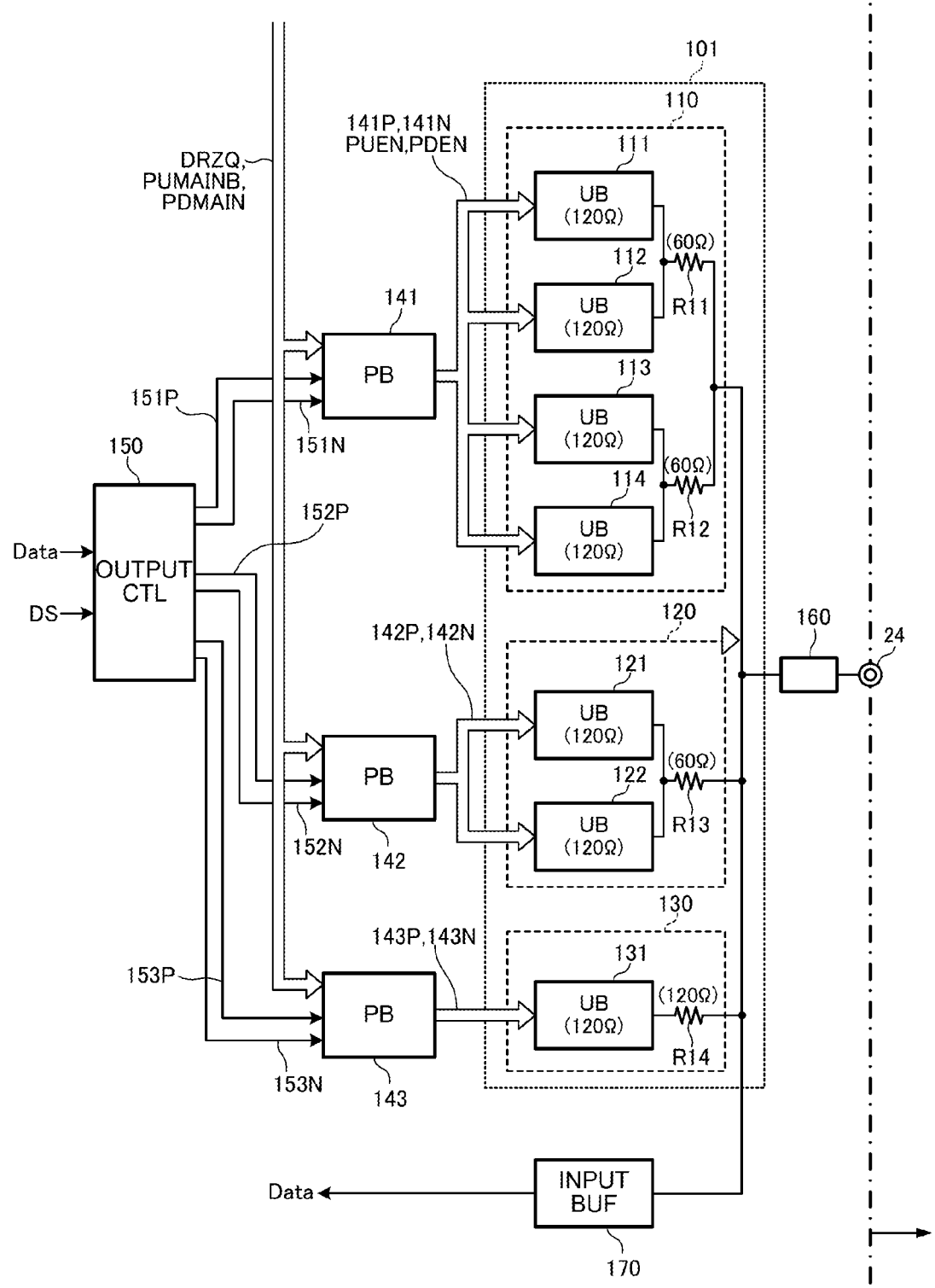
FIG. 2 is a functional block diagram of an input/output circuit according to an embodiment of the present invention.

FIG. 2 is a block diagram of a configuration of an input/output circuit 16 according to an embodiment of the invention.

As shown in FIG. 2, the input/output circuit 16 includes the output circuit 101, an input buffer 170, front-stage circuits 141, 142, and 143, and an output control circuit 150. The input/output circuit 16 further includes an electrostatic protection unit 160.

The output circuit 101 includes three output units 110, 120, and 130. The number of the output units of the present invention, however, is not limited to three.

The output unit 110 includes four unitary buffers 111 to 114 and damping resistances R11 and R12 which have the same resistance value of, for example, 60Ω and are coupled in parallel to each other. The output unit 120 includes two unitary buffers 121 and 122 and a damping resistance R13 having a resistance value of, for example, 60Ω The output unit 130 includes one unitary buffer 131 and a damping resistance R14 having a resistance value of, for example, 120Ω (r1). A high-resistance wiring layer can be used for the damping resistances R11 to R14, for example, a diffusion layer, tungsten (W), titanium nitride (TiN), etc. The number of the unitary buffers and damping resistances in the output units and the resistance values of the damping resistances according to the present invention are not limited to the number and resistance values indicated in FIG. 2. The unitary buffers 111 to 114, 121, 122, and 131 are each impedance-adjustable. According to the first embodiment, the impedance of each of the unitary buffers 111 to 114, 121, 122, and 131 is adjusted to, for example, 120Ω. This configuration allows a single calibration circuit to collectively adjust the impedances of multiple unitary buffers, thus simplifying a calibration operation.

At the front stage to the output units 110 to 130 are the front-stage circuits 141 to 143, respectively. The front-stage circuits 141 to 143 determine whether or not to activate the corresponding output units and adjust the impedances of unitary buffers included in the corresponding output units. As shown in FIG. 2, the front-stage circuits 141 to 143 are supplied with activating signals 151P to 153P (data) and activating signals 151N to 153N (data) from an output control circuit 150, respectively, and are further supplied with a common impedance adjusting information DRZQ and common enable signals PUMAINB and PDMAIN from the calibration circuit 100. Specifically, when instructed by the activating signals (data) 151P to 153P or activating signals (data) 151N to 153N to activate the corresponding output units, the front-stage circuits 141 to 143 specify which one of multiple output transistors (which will be described later) included in each of the unitary buffers 111 to 114, 121, 122, and 131 in the corresponding output units is to be activated, according to the impedance adjusting information DRZQ and enable signals PUMAINB and PDMAIN. Activation of the output transistors are thus specified by the activating signals 141P to 143P and activating signals 141N to 143N.

Enable signals PUEN and PDEN are signals that give an instruction to activate the output units 110, 120, and 130. The output control circuit 150 may supply test signals TSDN and TSDP (not depicted) that give an instruction to execute a test, to the output units 110, 120, and 130.

The output control unit 150 specifies any one or ones of the multiple output units 110 to 130 as an output unit to be activated and also specifies the output logical level of a unitary buffer to be activated. The output control unit 150 specifies an output unit to be activated, based on the drive capability signal DS supplied from the mode register 14.

In this manner, the output control unit 150 selects one or more output units to be activated based on the drive capability signal DS, thereby changes the number of unitary buffers that drive the data terminal. A change in the number of unitary buffers to be activated results in a change in the (output) impedance of the output terminal. As shown in FIG. 2, according to the first embodiment, the unitary buffers 111 to 114, 121, 122, and 131 are coupled in parallel between the output control circuit 150 and the data terminal 24. As a result, an increase in the number of unitary buffers to be activated results in a decrease in the output impedance, and an decrease in the number of unitary buffers to be activated results in an increase in the output impedance.

Figure 3:
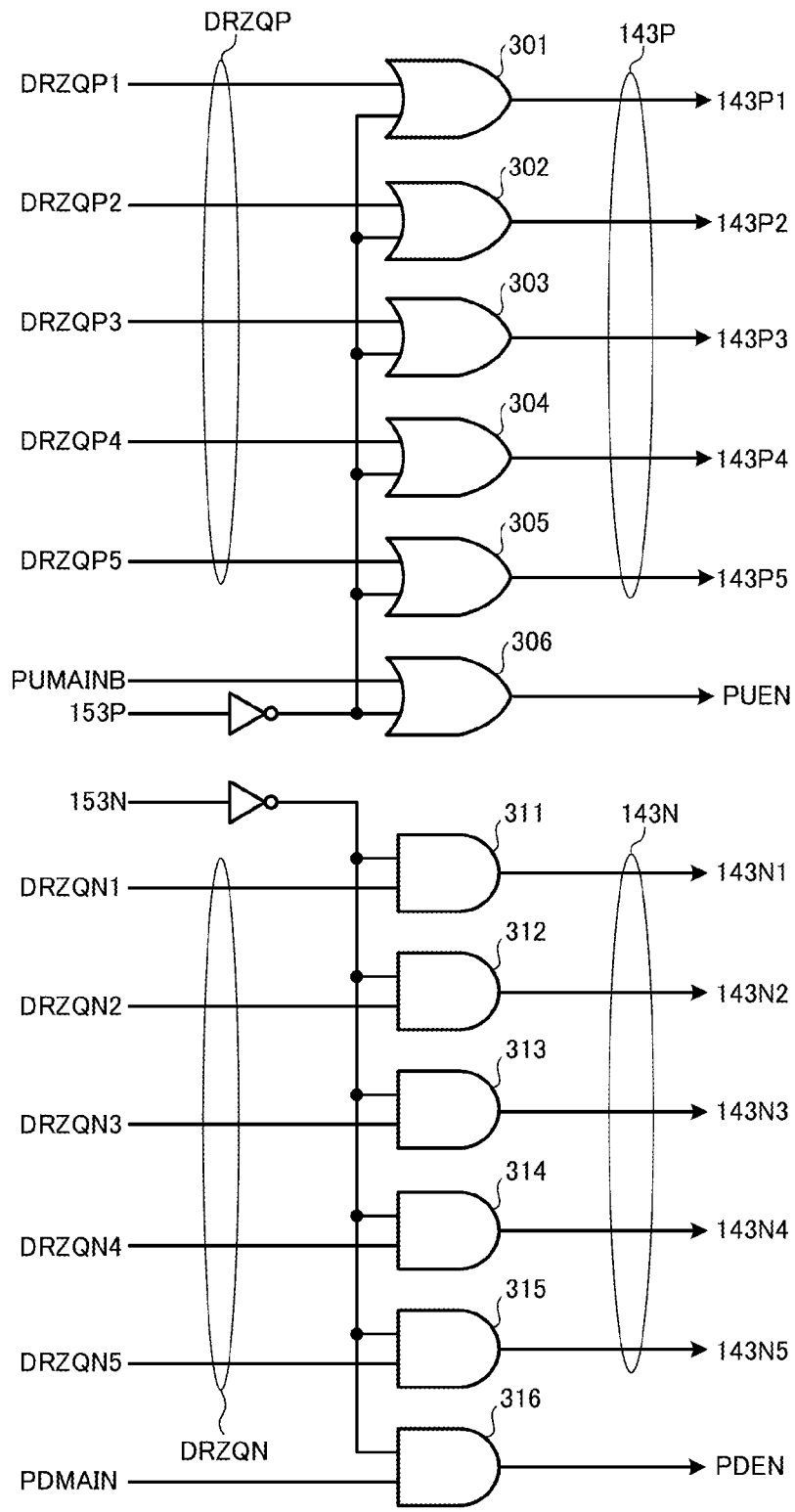
FIG. 3 is a schematic diagram of a front-stage circuit according to an embodiment of the present invention.

FIG. 3 is a circuit diagram of the front-stage circuit 143 according to an embodiment of the invention.

Since the front-stage circuits 141 and 142 are identical in configuration with the front-stage circuit 143, the front-stage circuit 143 will be described as a typical example of the front-stage circuits. The front-stage circuit 143 includes six OR circuits 301 to 306 and six AND circuits 311 to 316. The OR circuits 301 to 305 are supplied with the common activating signal 153P (read data) from the output control signal 150 and are also supplied with impedance adjusting information DRZQP1 to DRZQP5 from the calibration circuit 100, respectively. The OR circuit 306 is supplied with the activating signal 153P (read data) and with the enable signal PUMAINB.

The AND circuits 311 to 315 are supplied with the common activating signal 153N (read data) from the output control signal 150 and are also supplied with the impedance adjusting information DRZQN1 to DRZQN5 from the calibration circuit 100, respectively. The AND circuit 316 is supplied with the activating signal 153N (read data) and with the enable signal PDMAIN.

The activating signals 153P and 153N (read data) are controlled according to the logical value of data to be output from the corresponding data terminal DQ. Specifically, when a high-voltage level signal is output from the corresponding data terminal DQ, the activating signals 153P and 153N are set to a low-voltage level. When a low-voltage level signal is output from the corresponding data terminal DQ, the activating signals 153P and 153N are set to a high-voltage level. When an ODT (On Die Termination) function is used, by which the output circuit 101 serves as a terminal resistance, the activating signal 153P is set to a low-voltage level while the activating signal 153N is set to a high-voltage level.

Selection signals 143P1 to 143P5 (=143P) output from the OR circuits 301 to 305 and selection signals 143N1 to 143N5 (=143N) output from the AND circuits 311 to 315 are supplied to the output circuit 101, as shown in FIG. 2. An enable signal PUEN output from the OR circuit 306 and an output signal PDEN from the AND circuit 316 are also supplied to the output circuit 101.

Figure 4:
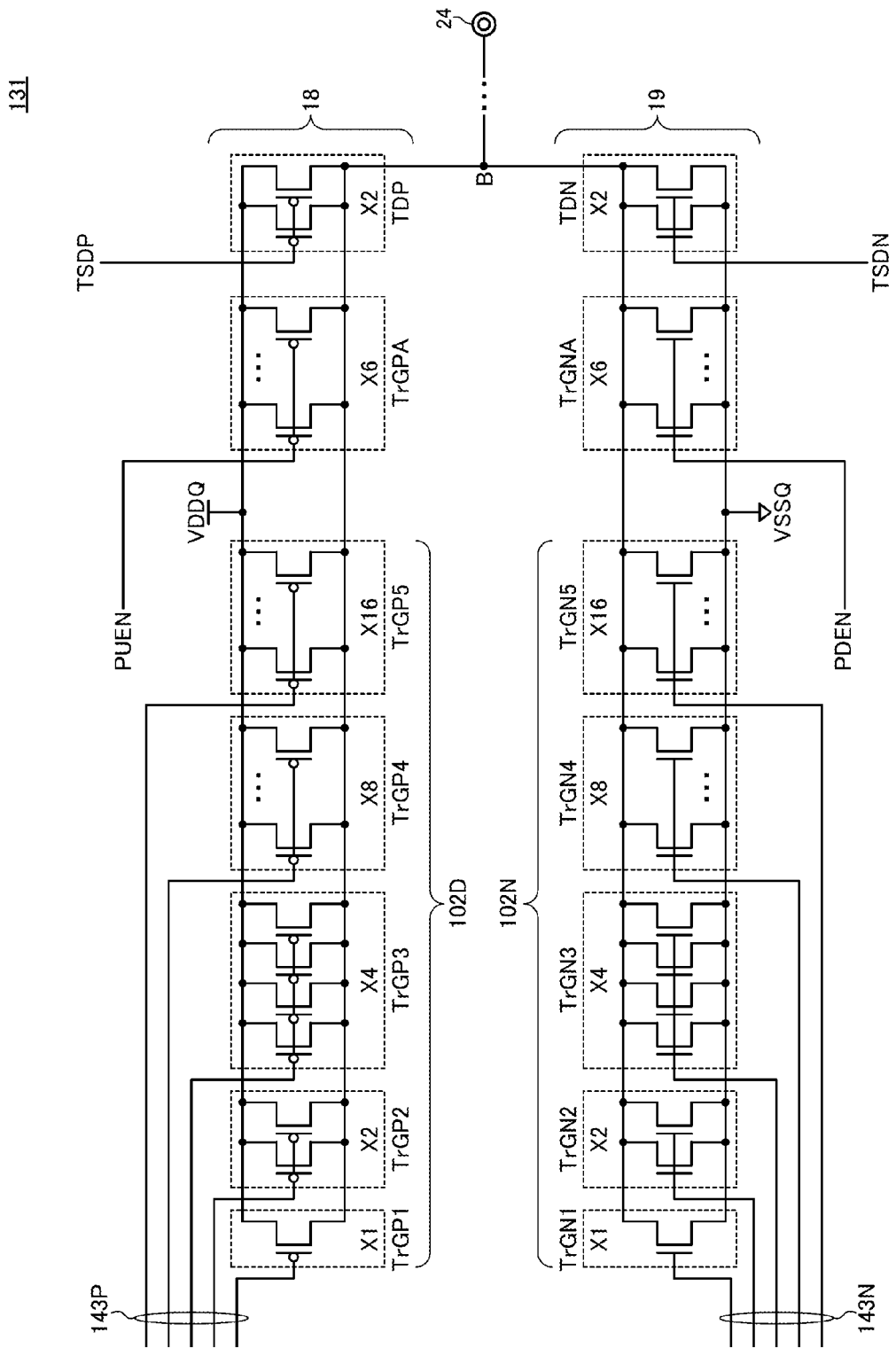
FIG. 4 is a schematic diagram of a unitary buffer according to an embodiment of the present invention.

FIG. 4 is a circuit diagram of the unitary buffer 131 according to an embodiment of the invention.

Since the other unitary buffers are identical in configuration with the unitary buffer 131, the unitary buffer 131 will be described as a typical example of unitary buffers.

As shown in FIG. 4, the unitary buffer 131 has multiple output PMOS transistors coupled in parallel between a power line (source voltage VDDQ) and a node B, and further has multiple output NMOS transistors coupled in parallel between a power line (source voltage VSSQ) and the node B. According to this embodiment, the output PMOS transistors have the same size as one another, that is, have the same width/length ratio as one another. Likewise, the output NMOS transistors have the same size as one another, that is, have the same width/length ratio as one another. However, the sizes of the output PMOS transistors are not limited to the same size but may be different from each other. Likewise, the sizes of the output NMOS transistors are not limited to the same size but may be different from each other. The node B is coupled to the data terminal 24 via the damping resistance R14. The part of unitary buffer 131 that includes the output PMOS transistors serves as a pull-up circuit 18, while the part of unitary buffer 131 that includes of the output NMOS transistors serves as a pull-down circuit 19.

The gates of the output PMOS transistors of the pull-up circuit 18 are supplied with five selection signals 143P1 to 143P5 serving as the selection signal 143P, and the gates of the output NMOS transistors of the pull-down circuit 19 are supplied with five selection signals 143N1 to 143N5 serving as the selection signal 143N. The pull-up circuit 18 includes transistor groups TrGP1 to TrGP5 (adjusting unit 102D) coupled in parallel. The transistor group TrGP1 includes one output PMOS transistor that receives the selection signal 143P1 at the gate electrode thereof. The drive capability of the transistor group TrGP1 is, therefore, one time (×1) the drive capability of one output PMOS transistor. The transistor group TrGP2 includes two PMOS transistors that receive the selection signal 143 at the gate electrodes thereof. The drive capability of the transistor group TrGP2 is, therefore, two times (×2) the drive capability of one output PMOS transistor. The drive capabilities of other transistor groups are determined in the same manner. For example, the transistor group TrGP5 includes 16 output PMOS transistors that receive the selection signal 143P5 at the gate electrodes thereof. The drive capability of the transistor group TrGP5 is, therefore, 16 times (×16) the drive capability of one output PMOS transistor.

The pull-down circuit 19 includes transistor groups TrGN1 to TrGN5 (adjusting unit 102N) coupled in parallel. The transistor group TrGN1 includes one transistor that receives the selection signal 143N1 at the gate electrode thereof. The drive capability of the transistor group TrGN1 is, therefore, one time (×1) the drive capability of one output NMOS transistor. The transistor group TrGN2 includes two NMOS transistors that receive the selection signal 143N2 at the gate electrodes thereof. The drive capability of the transistor group TrGN2 is, therefore, two times (×2) the drive capability of one output NMOS transistor. The drive capabilities of other transistor groups are determined in the same manner. For example, the transistor group TrGN5 includes 16 transistors that receive the selection signal 143N5 at the gate electrodes thereof. The drive capability of the transistor group TrGN5 is, therefore, 16 times (×16) the drive capability of one output NMOS transistor.

The pull-up circuit 18 also includes a transistor group TrGPA and a transistor group TDP. The transistor group TrGPA includes six output PMOS transistors that receive the enable signal PUEN at the gate electrodes thereof. The drive capability of the transistor group TrGPA is, therefore, six times (×6) the drive capability of the unit transistor. The transistor group TrGPA is a circuit that upon activation of the output unit 110, operates according to the activating signal 153P, regardless of the impedance adjusting information DRZQP.

The transistor group TDP includes two PMOS transistors that receive a test signal TSPD at gate electrodes thereof. The drive capability of the transistor group TDP is, therefore, two times (×2) the drive capability of the output PMOS transistor. The test signal TSDP is activated when a test is conducted.

The pull-down circuit 19 also includes a transistor group TrGNA and a transistor group TDN. The transistor group TrGNA includes six output NMOS transistors that receive the enable signal PDEN at the gate electrodes thereof. The drive capability of the transistor group TrGNA is, therefore, six times (×6) the drive capability of the output NMOS transistor. The transistor group TrGNA is a circuit that upon activation of the output unit 110, operates according to the activating signal 153N, regardless of the impedance adjusting information DRZQN.

The transistor group TDN includes two output NMOS transistors that receive a test signal TSDN at the gate electrodes thereof. The drive capability of the transistor group TDN is, therefore, two times (×2) the drive capability of the output NMOS transistor. The test signal TSDN is activated when a test is conducted.

The pull-up circuit 18 and the pull-down circuit 19 are so designed that they each have a given impedance (120Ω in this embodiment) when supplied with current. However, the on-resistance of transistors varies depending on manufacturing conditions and changes according to environmental temperatures and source voltages during operation of the transistors. It is therefore not always possible for the pull-up circuit 18 and pull-down circuit 19 to achieve the desired impedance. For this reason, to achieve an actual target impedance, the number of transistors to be switched on must be adjusted.

Figure 5:
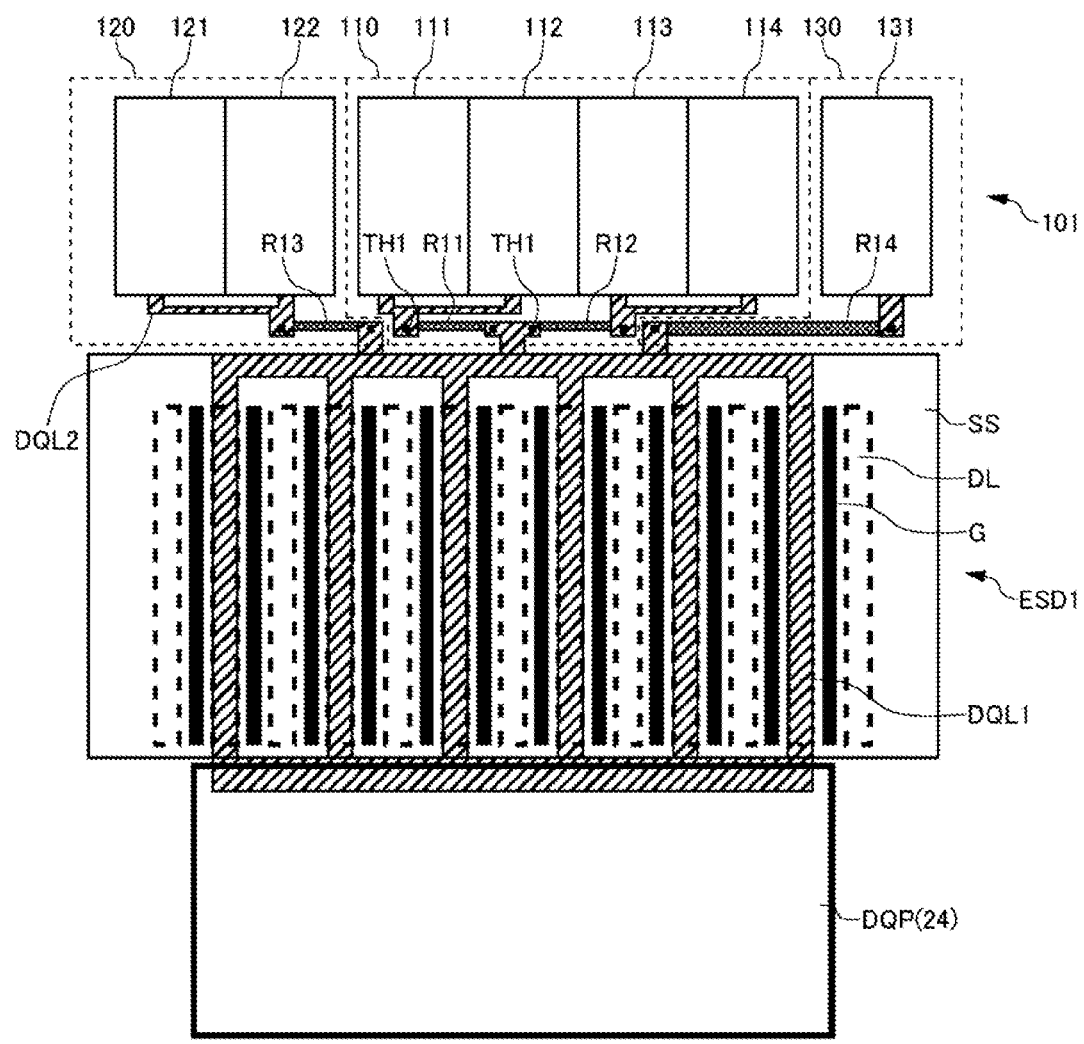
FIG. 5 shows the layout of a portion between a data terminal and an output circuit according to an embodiment of the present invention.
Figure 6:
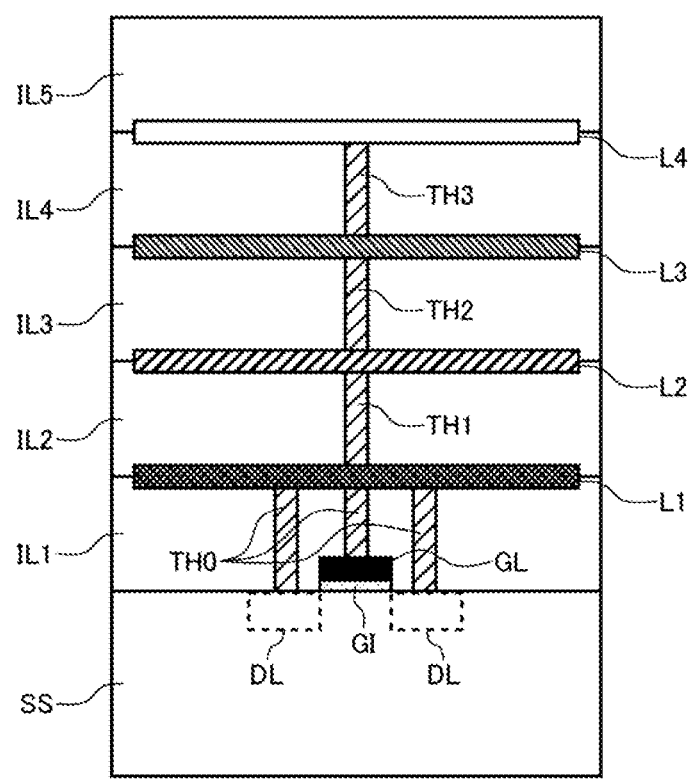
FIG. 6 depicts a multi-level wiring structure included in the semiconductor device of the first embodiment according to an embodiment of the present invention.

FIG. 5 shows the layout of a part between the data terminal 24 and the output circuit 101 according to an embodiment of the invention. FIG. 6 depicts a multi-level wiring structure included in the semiconductor device 10 of the first embodiment.

As shown in FIG. 6, the semiconductor device 10 of the first embodiment has a multi-level wiring structure in which diffusion layers DL are formed in a substrate SS, gate wiring layers GL are formed on the surface of the substrate SS. On the gate wiring layers GL, a first wiring layer L1, a second wiring layer L2, a third wiring layer L3, and a fourth wiring layer L4 are overlaid in increasing order in which the first wiring layer L1 is the closest to the surface of the substrate SS. The first wiring layer L1 is, for example, a wiring layer containing tungsten, and each of the second to fourth wiring layers is a wiring layer containing aluminum, copper, etc. These wiring layers are insulated from one another via inter-layer insulating layers IL1 to IL4. The upper surface of the uppermost fourth wiring layer L4 is covered with a protective inter-layer insulating layer IL5. A thin gate insulating film GI is formed between the gate wiring layer GL and the surface of the substrate SS. The diffusion layer DL, the gate wiring layer GL, and the first wiring layer L1 are electrically coupled at their necessary parts via through-hole electrodes TH0 penetrating the first insulating layer IL1. In the same manner, the first wiring layer L1 and the second wiring layer L2 are electrically coupled at their necessary parts via through-hole electrodes TH1 penetrating the second insulating layer IL2. The second wiring layer L2 and the third wiring layer L3 are electrically coupled at their necessary parts via through-hole electrodes TH2 penetrating the third insulating layer IL3. The third wiring layer L3 and the fourth wiring layer L4 are electrically coupled at their necessary parts via through-hole electrodes TH3 penetrating the fourth insulating layer IL4.

As shown in FIG. 5, an area, which is between a data pad DQP (corresponding to the data terminal 24) formed as the fourth wiring layer L4 and the output circuit 101, includes an ESD element ESD1 formed into an MOS transistor structure. Further included are damping resistances R11 to R14 each formed as the first wiring layer L1, a data line DQL1, which is formed as the second wiring layer L2 and passes above the ESD element ESD1 to connect the data pad DQP to respective one ends of the damping resistances R11 to R14, and data lines DQL2 each of which connects the other end of the corresponding damping resistance out of the damping resistances R11 to R14 to one or ones of unitary buffers corresponding to the data line DQL2 out of the unitary buffers 111 to 114, 121, 122, and 131. The ESD element ESD1 includes sources and drains formed as the diffusion layers DL in the substrate SS made of silicon, etc., and gate electrodes G formed on the substrate SS. One of the sources and drains of the ESD element ESD1 are coupled to the data line DQL1 via the through-holes TH0 and TH1 and the first wiring layer L1 (which are not shown in FIG. 5). The other of the sources and drains of the ESD element ESD1 are coupled to a power line (source voltage VSS), which is not depicted. The data pad DQP is coupled to the data line DQL1 via the through-holes TH2 and TH3 and the third wiring layer L3 (which are not shown in FIG. 5). The data line DQL1 and respective one ends of the damping resistances R11 to R14 are coupled via the through-hole electrodes TH1. Similarly, the other ends of the damping resistances R11 to R14 and the data line DQL2 are coupled via the corresponding through-hole electrodes TH1. The front-stage circuits 141 to 143 are disposed adjacent to the output circuit 101, which is not shown in FIG. 5.

Figure 7:
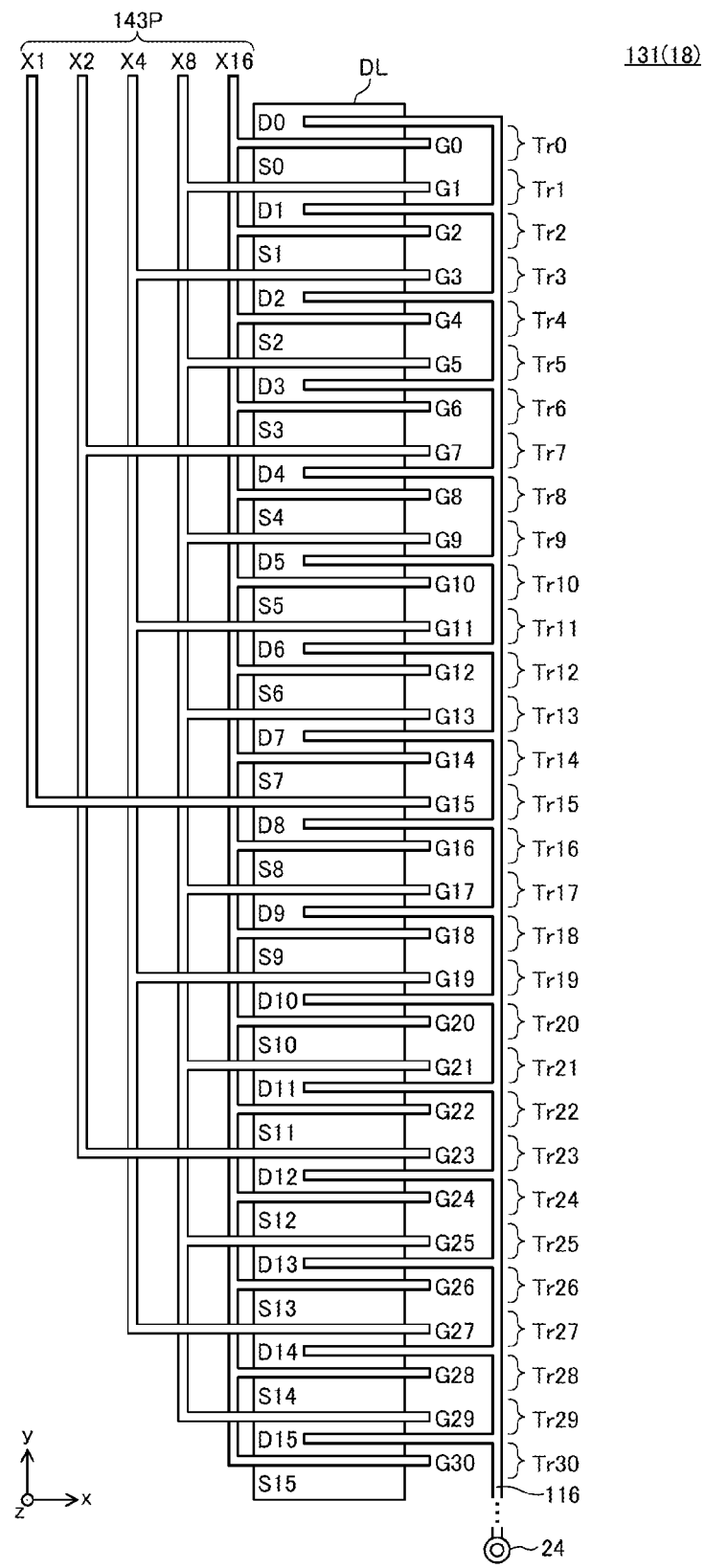
FIG. 7 is a view of a layout of a unitary buffer according to an embodiment of the present invention.

FIG. 7 is a view of the layout of a part of the pull-up circuit 18 of FIG. 4 according to an embodiment of the invention. Specifically, FIG. 7 depicts the layout of the transistor groups TrGP1 to TrGP5. To make the description of an operation principle clear, the transistor groups TrGPA and TDP are omitted from FIG. 7.

In FIG. 7, transistors Tr0 to Tr30 correspond to the multiple output PMOS transistors of FIG. 4. Each of the transistors Tr0 to Tr30 includes a source diffusion layer S and a drain diffusion layer D, which are formed as the diffusion layers DS in the substrate SS, and a gate electrode G formed as the gate wiring layer GL. Under the gate electrode G, a channel region is formed as a region defined between the source diffusion layer S and the drain diffusion layer D. It is preferable that channel widths W (lengths of the channel regions in the x direction) of the transistors Tr0 to Tr30 be substantially equal to one another and that channel lengths (lengths of the channel regions in the y direction) of the same be substantially equal to one another. It is clearly understood from FIG. 7 that transistors adjacent to each other in the y direction share the source diffusion layer or drain diffusion layer. For example, the transistor Tr1 and the transistor Tr2 share the source diffusion layer S1.

The drain diffusion layers D0 to D15 of the transistors Tr0 to Tr30 are all coupled to the output terminal 24 via an interconnect 116. The source diffusion layers S0 to S15 of the transistors Tr0 to Tr30 are supplied with the common source voltage VDDQ, which is not depicted in FIG. 7.

16 transistors Tr0, Tr2, Tr4, Tr6, Tr8, Tr10, Tr12, Tr14, Tr16, Tr18, Tr20, Tr22, Tr24, Tr26, Tr28, and Tr30 correspond to the output PMOS transistors included in the transistor group TrGP5. Likewise, eight transistors Tr1, Tr5, Tr9, Tr13, Tr17, Tr21, Tr25, and Tr29 correspond to the transistors included in the transistor group TrGP4, four transistors Tr3, Tr11, Tr19, and Tr27 correspond to the transistors included in the transistor group TrGP3, two transistors Tr7 and Tr23 correspond to the transistors included in the transistor group TrGP2, and a transistor Tr15 corresponds to the transistor included in the transistor group TrGP1.

As shown in FIG. 7, the gate electrodes G0, G2, G4, G6, G8, G10, G12, G14, G16, G18, G20, G22, G24, G26, G28, and G30 of the transistors Tr0, Tr2, Tr4, Tr6, Tr8, Tr10, Tr12, Tr14, Tr16, Tr18, Tr20, Tr22, Tr24, Tr26, Tr28, and Tr30 are all coupled to a signal line X16 through which the selection signal 143P5 is transmitted. Likewise, gate electrodes G1, G5, G9, G13, G17, G21, G25, and G29 are all coupled to a signal line X8 through which the selection signal 143P4 is transmitted, gate electrodes G3, G11, G19, and G27 are all coupled to a signal line X4 through which the selection signal 143P3 is transmitted, gate electrodes G7 and G23 are all coupled to a signal line X2 through which the selection signal 143P2 is transmitted, and a gate electrode G15 is coupled to a signal line X1 through which the selection signal 143P1 is transmitted.

According to this embodiment, the transistors Tr0 to Tr30 are laid out based on the following method.

First, a group 1 is made up by putting a set of two transistors from the transistor group TrGP5 and one transistor from the transistor group TrGP4 together. This process is repeated for all sets of two transistors from the transistor group TrGP5 and all transistors from the transistor group TrGP4 to create multiple groups 1. In each group 1, one transistor from the transistor group TrGP4 is placed between two transistors from the transistor group TrGP5. For example, a group of the transistors Tr0 to Tr2 shown in FIG. 7 constitutes a group 1. As a result, eight groups 1 are created in FIG. 7.

Then, two groups 1 out of the multiple groups 1 and one transistor from the transistor group TrGP3 are put together to make up a group 2. This process is repeated for all sets of two groups 1 out of the multiple groups 1 and all transistors from the transistor group TrGP3 to create multiple groups 2. In each group 2, one transistor from the transistor group TrGP3 is placed between two groups 1. For example, a group of the transistors Tr0 to Tr6 shown in FIG. 7 constitutes a group 2. As a result, four groups 2 are created in FIG. 7.

Subsequently, two groups 2 out of the multiple groups 2 and one transistor from the transistor group TrGP2 are put together to make up a group 3. This process is repeated for all sets of two groups 2 out of the multiple groups 2 and all transistors from the transistor group TrGP2 to create multiple groups 3. In each group 3, one transistor from the transistor group TrGP2 is placed between two groups 2. For example, a group of the transistors Tr0 to Tr14 shown in FIG. 7 constitutes a group 3. As a result, two groups 3 are created in FIG. 7.

Finally, the transistor of the transistor group TrGP1 is placed between two groups 3 to complete the layout of FIG. 7.

This layout of the transistors making up the transistor groups TrGP1 to TrGP5 suppresses impedance variances caused by interconnect resistance differences between impedance adjustment steps.

Figure 8:
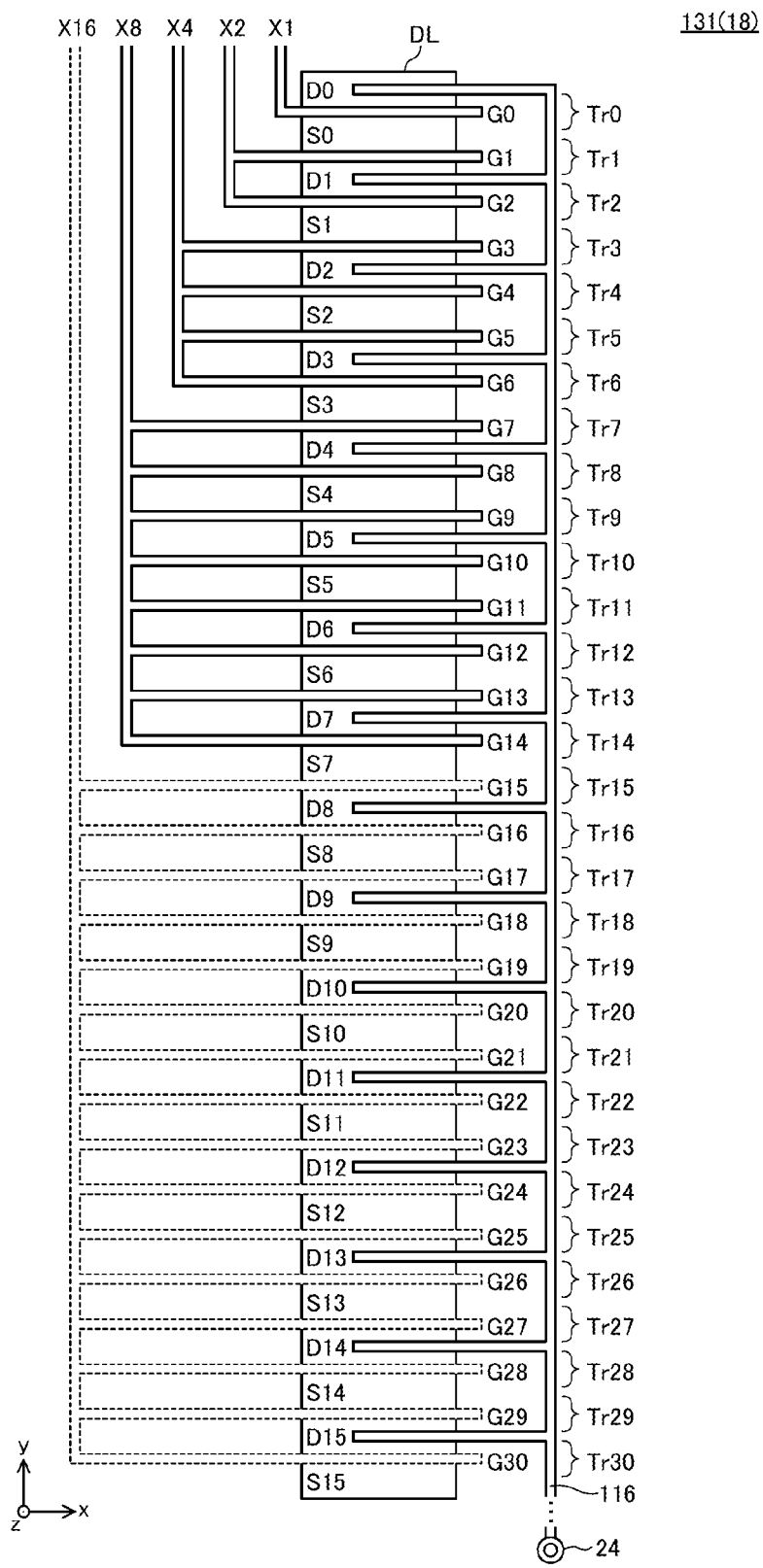
FIG. 8 is a state diagram (state 1) of a unitary buffer as according to a comparative example.
Figure 9:
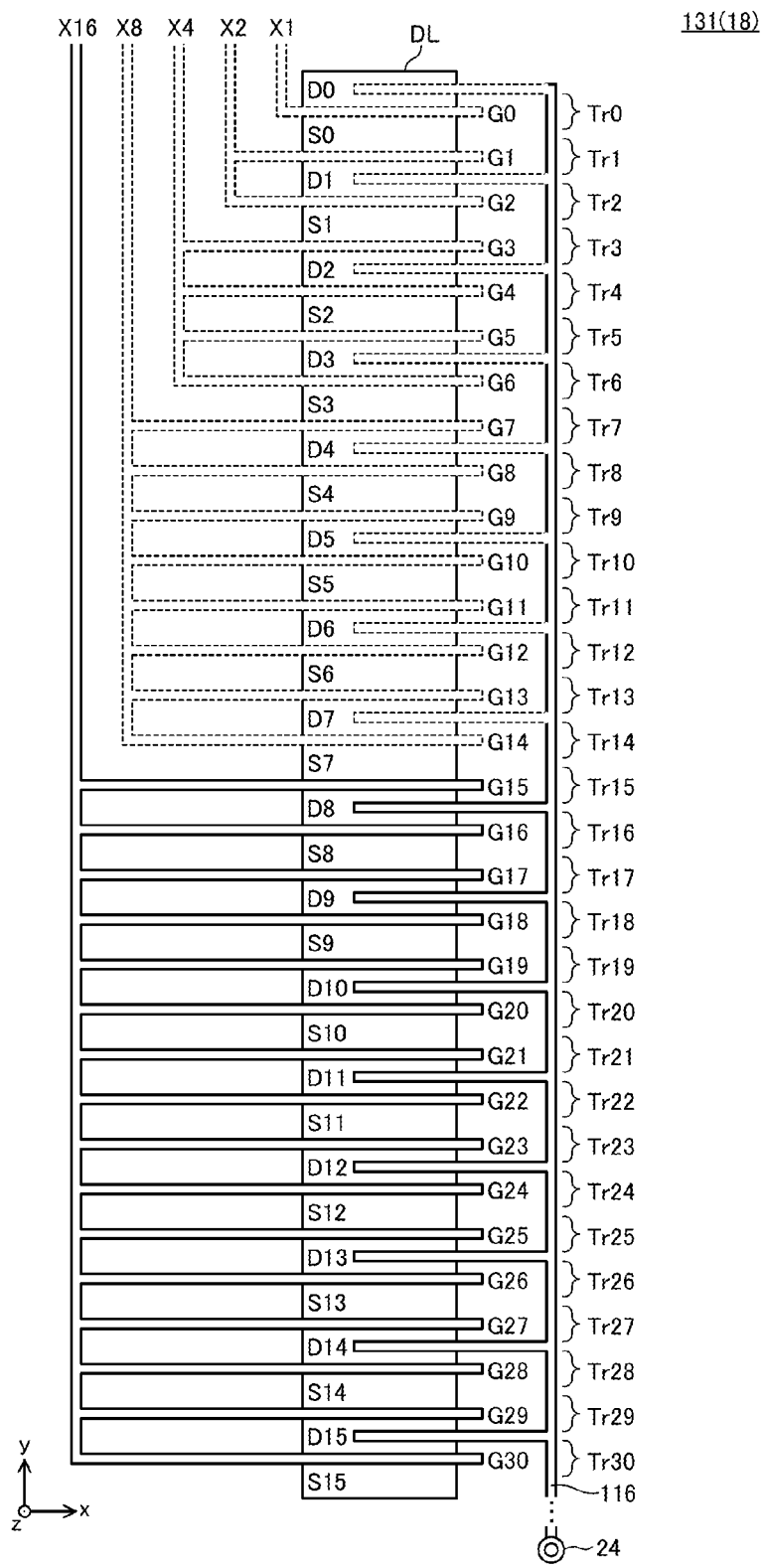
FIG. 9 is a state diagram (state 2) of a unitary buffer as according to a comparative example.

FIGS. 8 and 9 are views of the layouts of the pull-up circuit as comparative examples. In the comparative examples, the transistor groups TrGP1 to TrGP5 are lined up in the y direction. Specifically, FIG. 8 depicts a state 1 in which the selection signals 143P1 to 143P4 (X1, X2, X4, X8) are at low-voltage level, i.e., active level, while the selection signal 143P5 (X16) is at high-voltage level, i.e., inactive level. FIG. 9 depicts a state 2 in which the selection signals 143P1 to 143P4 (X1, X2, X4, X8) are at high-voltage level, i.e., inactive level, while the selection signal 143P5 (X16) is at low-voltage level, i.e., active level. In the comparative examples, transition between the state 1 and the state 2 leads to a significant change in the actual resistance of the signal line 116.

Figure 10:
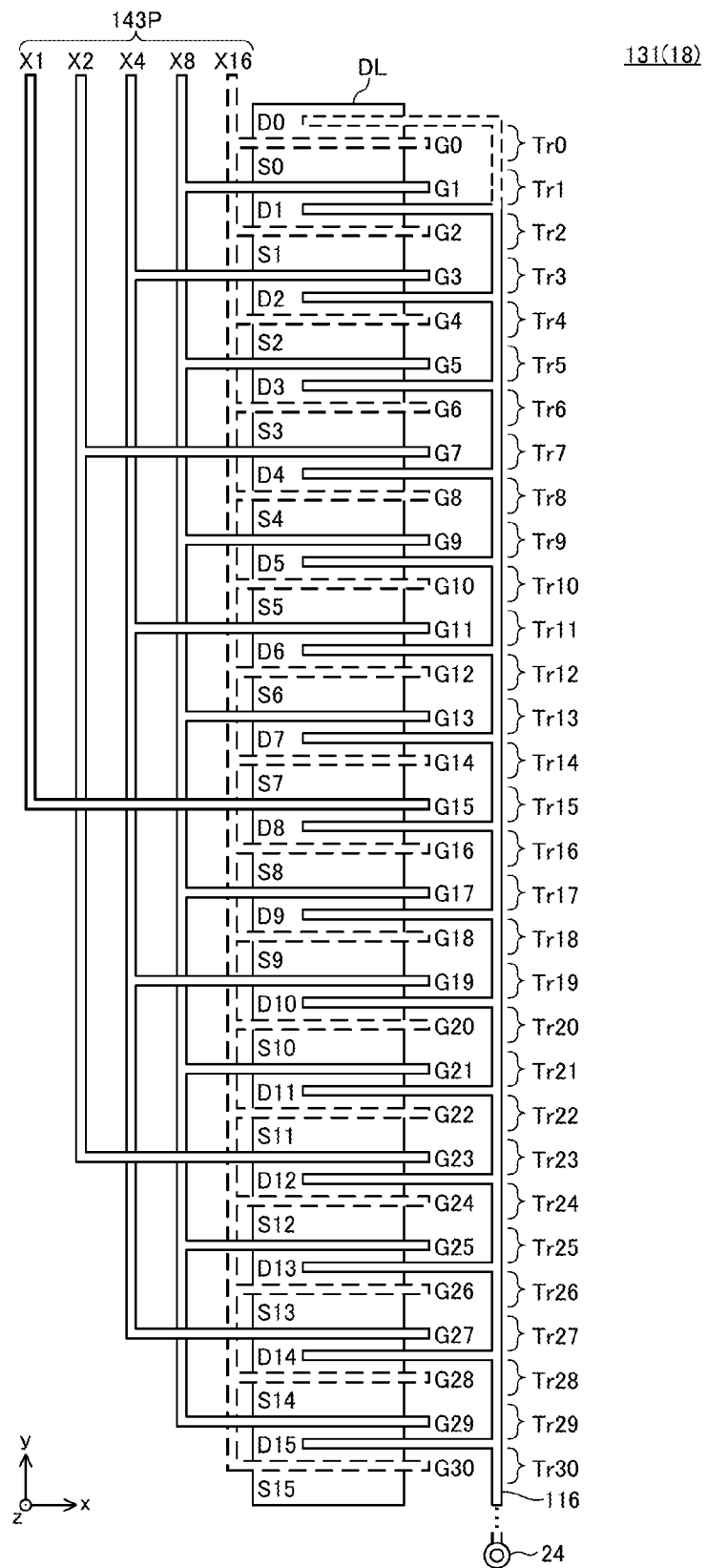
FIG. 10 is a state diagram (state 1) of a unitary buffer according to an embodiment of the present invention.
Figure 11:
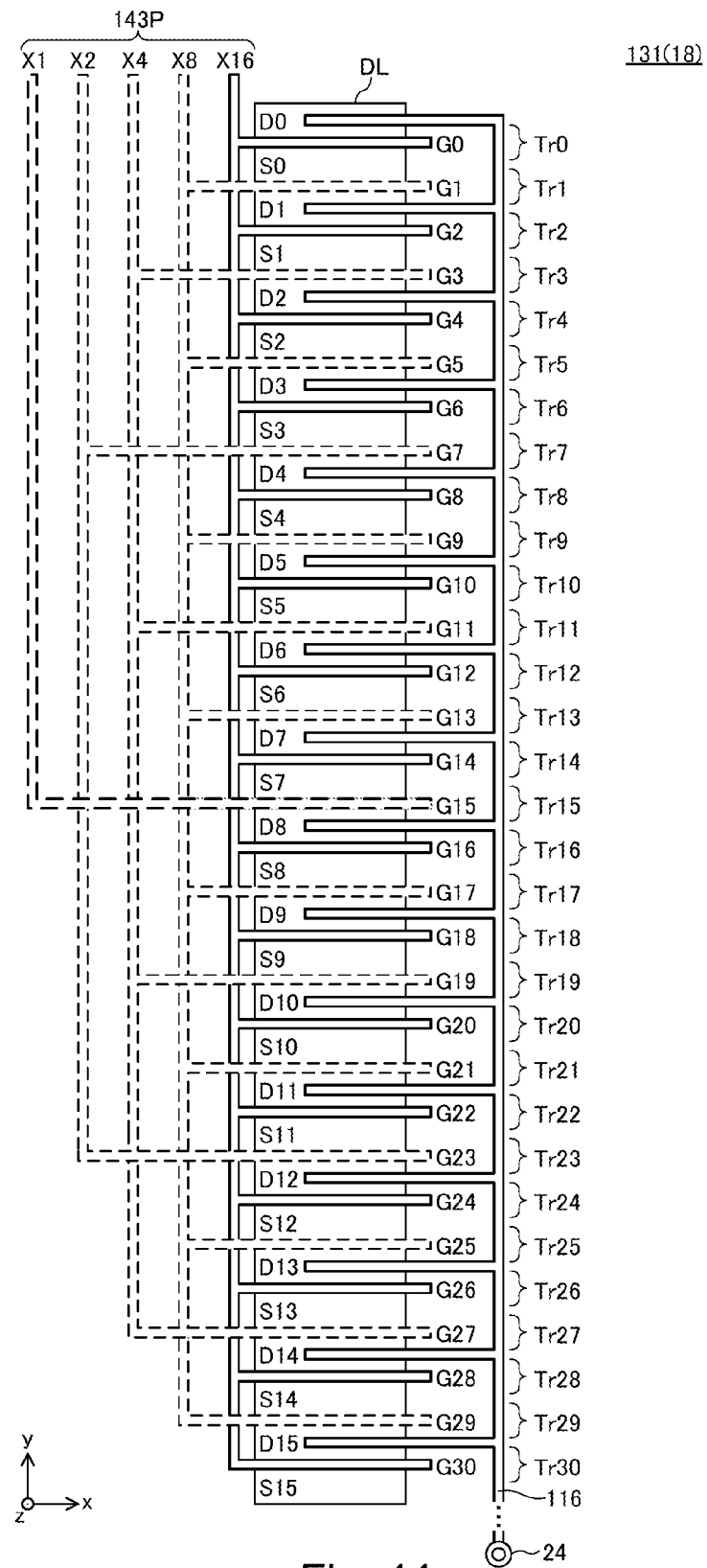
FIG. 11 is a state diagram (state 2) of a unitary buffer according to an embodiment of the present invention.

FIGS. 10 and 11 are layout views of the state 1 and the state 2 of the pull-up circuit of the first embodiment is applied. FIGS. 10 and 11 clearly indicate that a change in the interconnect resistance of the signal line 116 is reduced, compared to the comparative examples of FIGS. 8 and 9.

While the pull-up circuit 18 has been described so far, the multiple output NMOS transistors included in the pull-down circuit 19 may also be laid out by virtually the same method as the layout method for the pull-up circuit 18. In such a case, the pull-down circuit 19 offers virtually the same effect as the effect offered by the pull-up circuit 18.

The method of arranging the transistors Tr according to the first embodiment is generalized in the following manner. When the selection signal 143P is of n-bit signals, each of which corresponds to a different one of binary-weighted transistor groups, a transistor A1 that receives a selection signal X1 (first digit) as a gate signal is disposed at the center of the diffusion region. Then, two transistors A2 that receive a selection signal X2 (second digit) as a gate signal are so disposed that the transistor A1 is placed between the two transistors A2. Four transistors A3 that receive a selection signal X4 (third digit) as a gate signal are so disposed that the two transistors A2 are placed between the four transistors A3. Eight transistors A4 that receive a selection signal X8 (fourth digit) as a gate signal are so disposed that the four transistors A3 are placed between the eight transistors A4. In the same manner, transistors A(n) that receive a selection signal for the n-th digit as a gate signal are so disposed that transistors A (n−1) for the (n−1)-th digit are placed between the transistors A(n).

Figure 12:
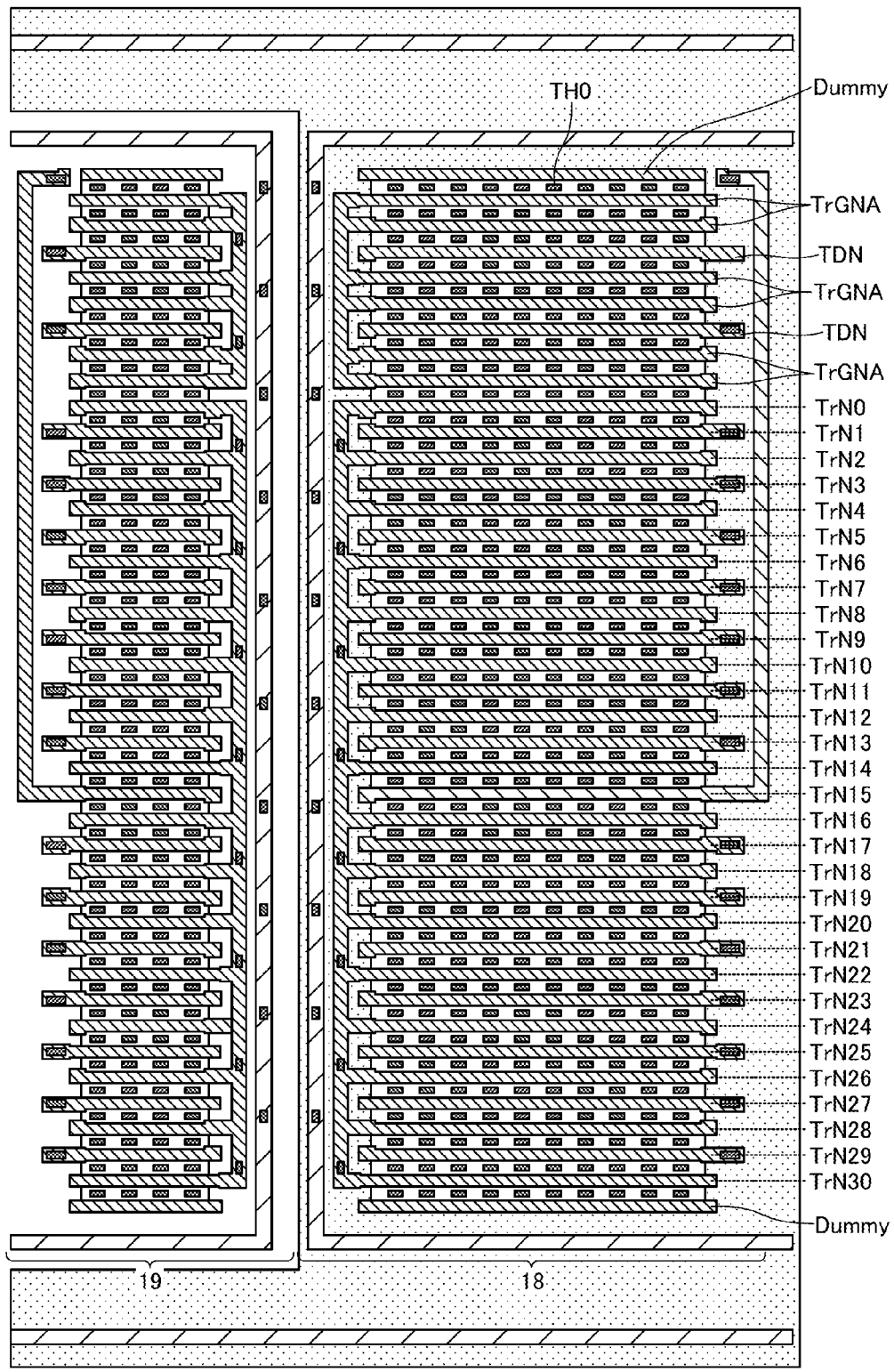
FIG. 12 shows a detailed layout of diffusion layers and gate electrodes in a region where a unitary buffer is formed according to an embodiment of the present invention.

FIG. 12 shows a detailed layout of diffusion layers and gate electrodes in a region where a unitary buffer is formed according to an embodiment of the present invention. In the first embodiment, each of the pull-down circuit 19 and the pull-up circuit 18 is provided with the 16-channel transistor, as shown in FIG. 4. Transistor groups TrGNA and TDN not involved in impedance adjustment are disposed next to the transistor groups TrGNA. On both ends of the diffusion layers DL, dummy lines are disposed.

Figure 13:
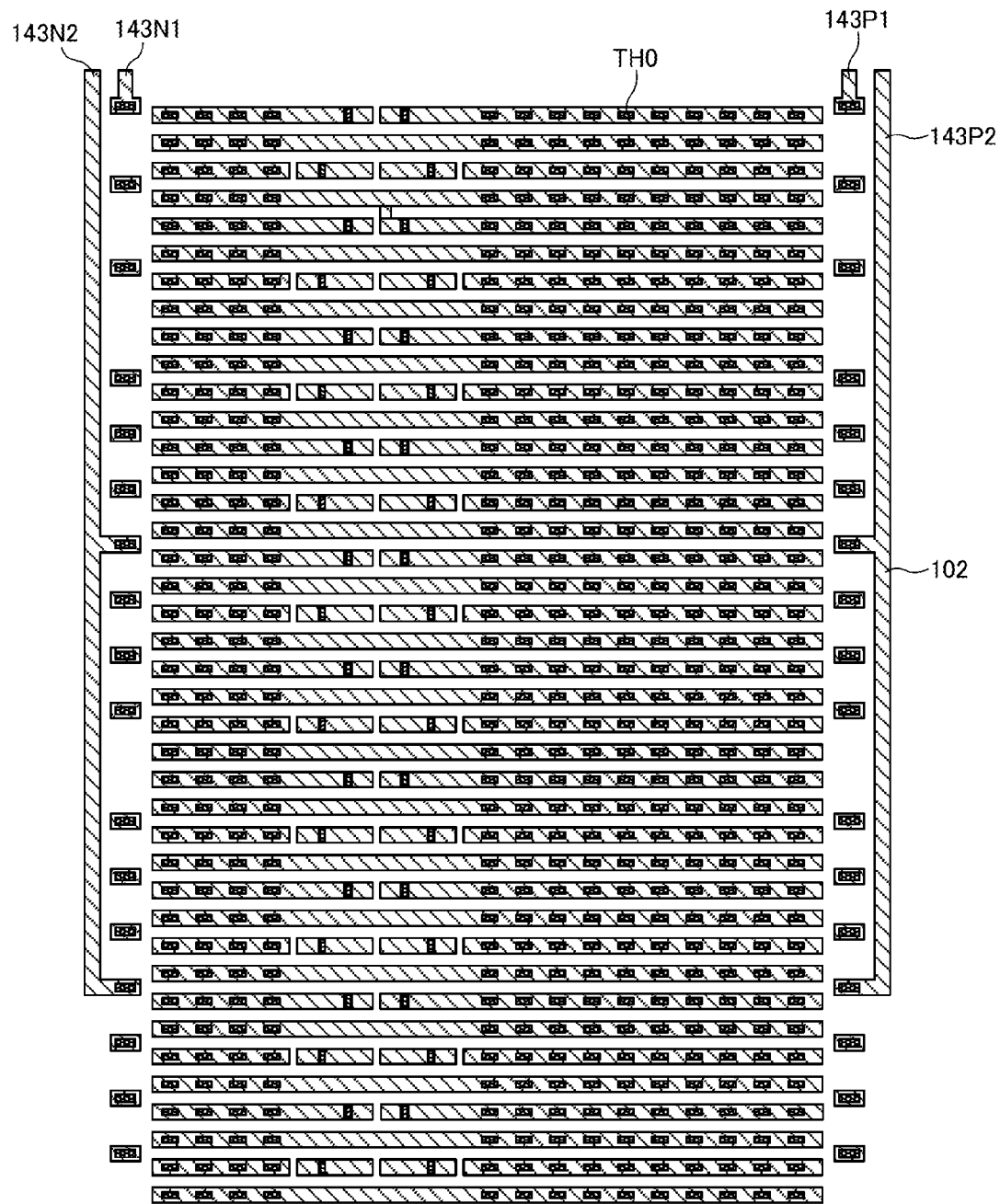
FIG. 13 shows a detailed layout of first signal lines formed as a first wiring layer in a region where a unitary buffer is formed according to an embodiment of the present invention.
Figure 14:
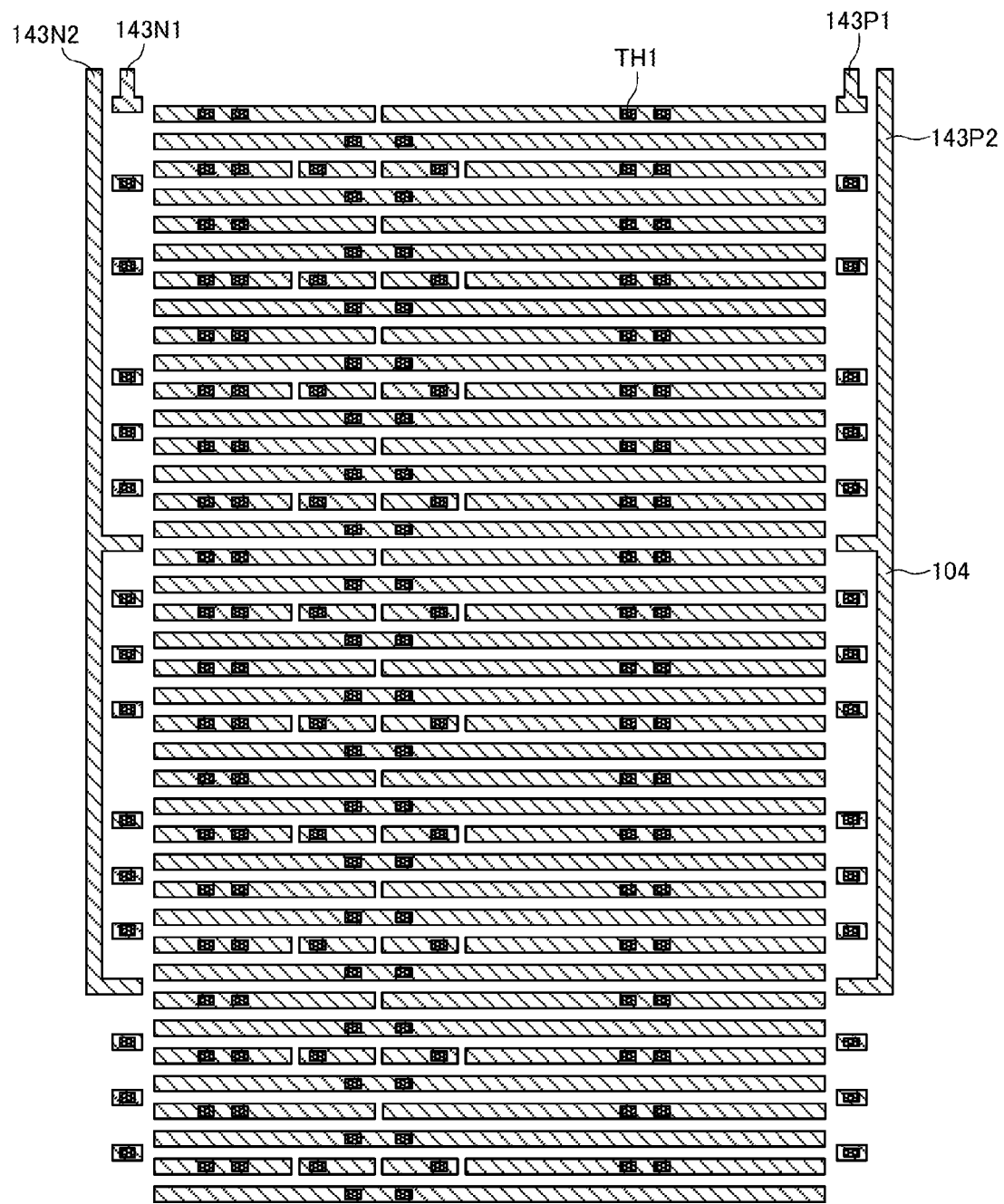
FIG. 14 shows a detailed layout of first signal lines formed as a first wiring layer in a region where a unitary buffer is formed according to an embodiment of the present invention.
Figure 15:
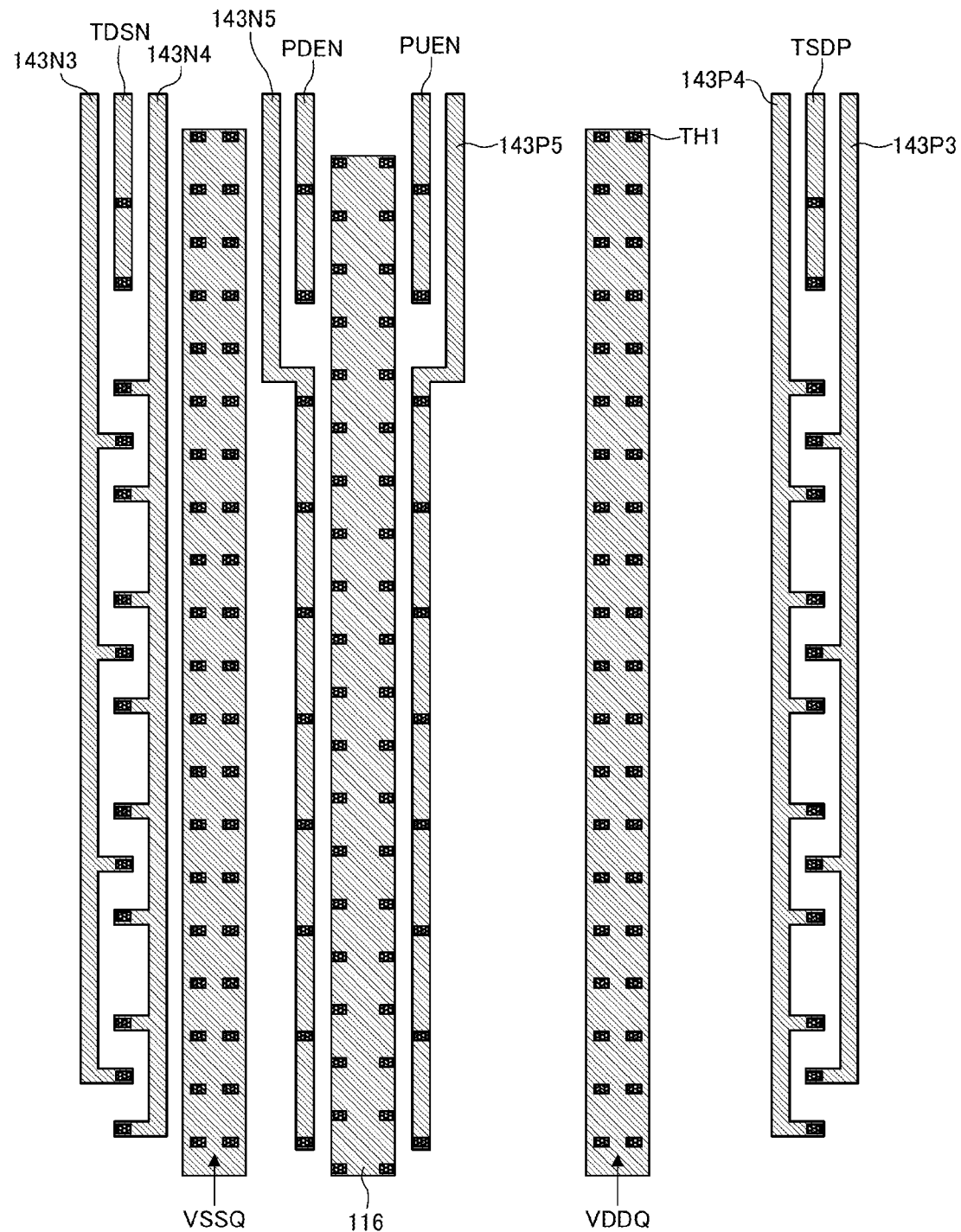
FIG. 15 shows a detailed layout of second signal lines formed as a second wiring layer in a region where a unitary buffer is formed according to an embodiment of the present invention.

FIGS. 13 and 14 shows detailed layouts of first signal lines formed as the first wiring layer L1 in the region where the unitary buffer 131 is formed according to an embodiment of the present invention. FIGS. 13 and 14 depict the same wiring layers. A number of through-hole electrodes TH0 shown in FIG. 13 couple multiple first signal lines 103 formed as the first wiring layer L1 to multiple signal lines (including gate electrodes) formed as diffusion layers DL and gate wiring layers GL of FIG. 12, respectively. A number of through-hole electrodes TH1 shown in FIG. 14 connect the multiple first signal lines to multiple second signal lines 104 formed as the second wiring layer L2 of FIG. 15 (which will be described later), respectively.

As shown in FIGS. 12 to 15, the selection signals 143P3 to 143P5 and 143N3 to 143N5, the enable signals PUEN and PDEN, and the test signals TSDP and TSDN are supplied from the front-stage circuit 143 through the second signal lines 104 to the region where the unitary buffer 131 is formed. These signals are transmitted from the second wiring layer L2 through the through-hole electrodes TH1 to the first wiring layer L1, i.e., first signal lines 103. The first signal lines 103 are coupled to the signal lines making up the gate wiring layers GL (including the gate electrodes) under the first signal lines 103, via the through-hole electrodes TH0. The selection signals 143P1, 143P2, 143N1, and 143N2 are supplied from the front-stage circuit 143 through the first signal lines 103 to the region where the unitary buffer 131 is formed.

A second embodiment of the present invention will now be described. According to the second embodiment, the multiple output PMOS transistors and NMOS transistors in the unitary buffer 131 are formed as vertical transistors. For simpler description, a unitary buffer not including the transistor groups TrGP5 and TrGN5 of FIG. 4 will be described as an example.

Figure 16:
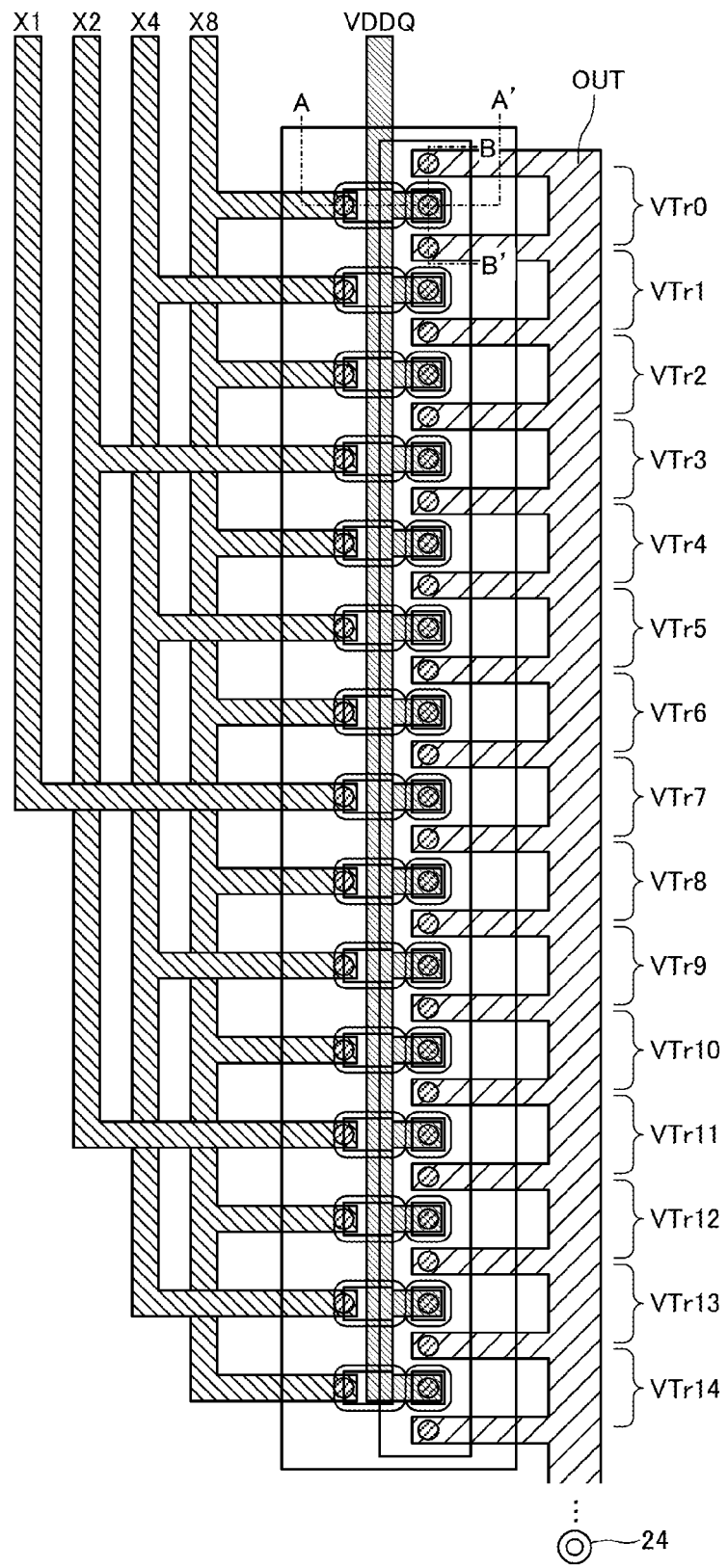
FIG. 16 is a view of a unitary buffer according to an embodiment of the present invention.

FIG. 16 is a view of a unitary buffer according to the second embodiment of the present invention. In the same manner as in FIG. 9, the transistor groups TrGPA and TDP are omitted from FIG. 16 for clear description of the operation principle.

In FIG. 16, vertical transistors VTr0 to VTr14 correspond to multiple output PMOS transistors. The structure of the vertical transistors will be described briefly by describing the structure of the vertical transistor VTr0 as an example.

Figure 17:
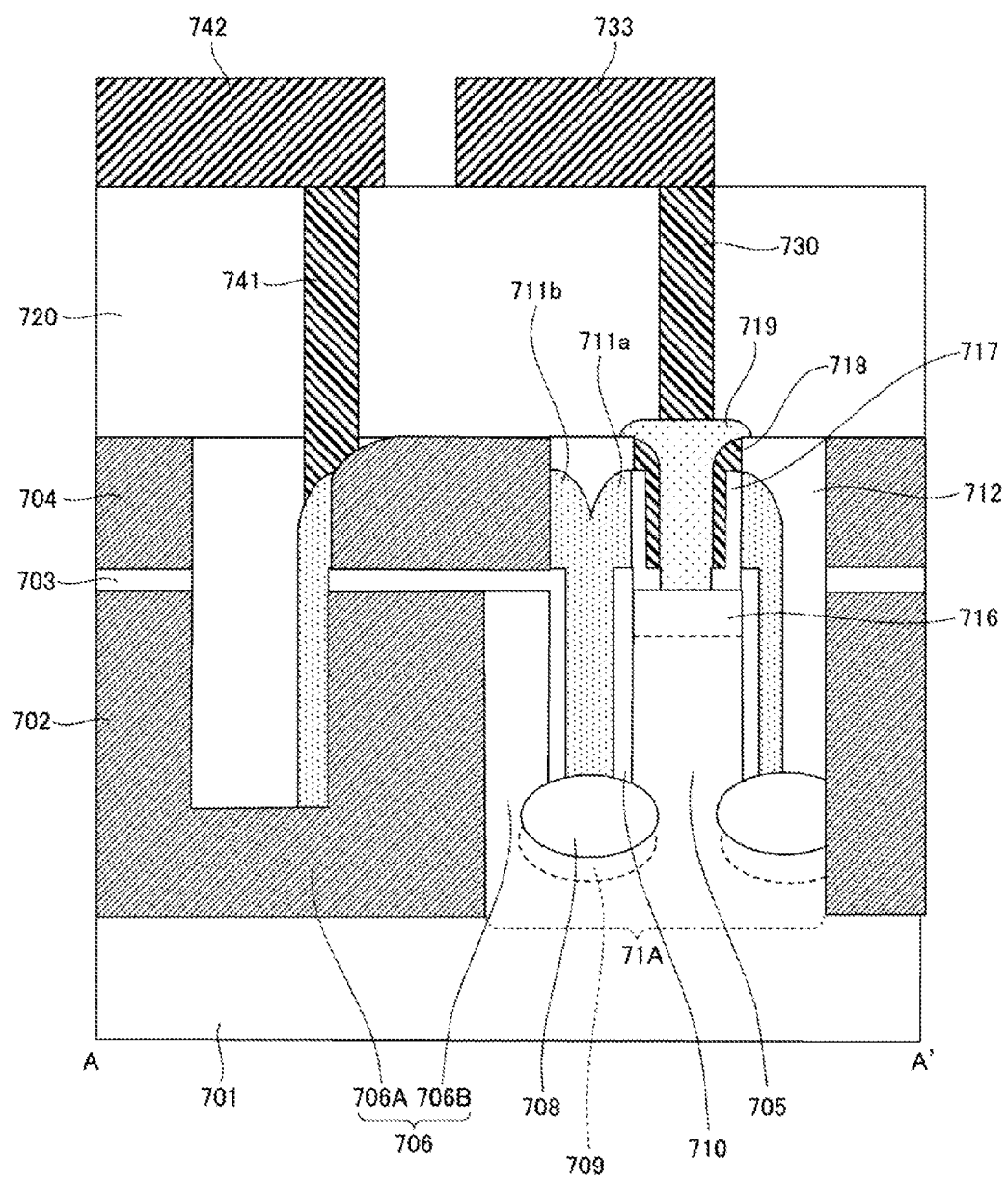
FIG. 17 is a (A-A') sectional view of a vertical transistor according to an embodiment of the present invention.
Figure 18:
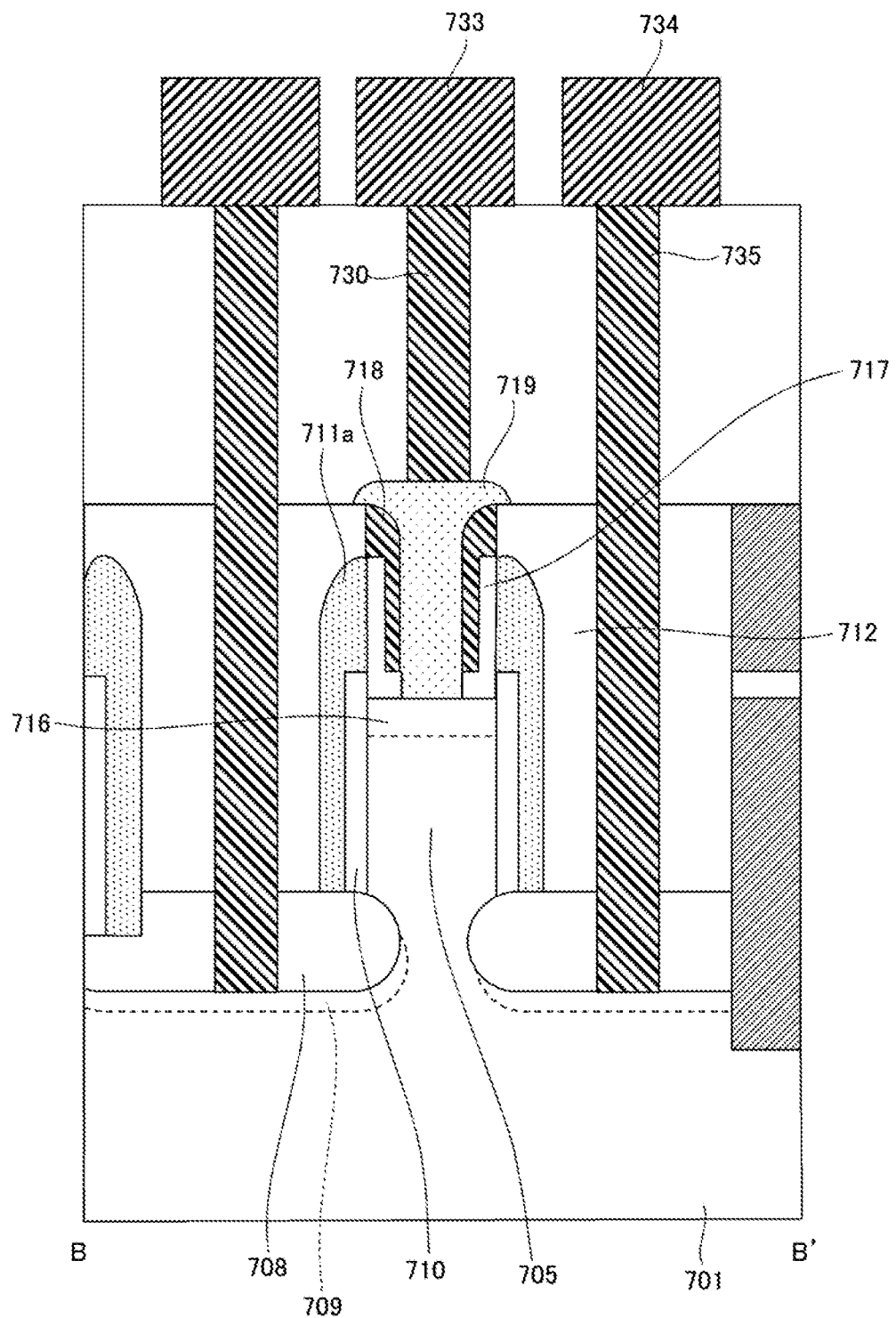
FIG. 18 is a (B-B') sectional view of a vertical transistor according to an embodiment of the present invention.

FIG. 17 is an A-A' sectional view of the vertical transistor VTr0 of FIG. 16 and FIG. 18 is a B-B' sectional view of the same.

On the upper surface of a silicon substrate 701, an element isolation region 702 made of an insulating film is formed. In an activation region 71A made of the silicon substrate surrounded with the element isolation region 702, a transistor pillar 705 serving as a semiconductor pillar is formed. On the side wall of the transistor pillar, a gate electrode 711a is so formed as to encircle the transistor pillar 705 with an intervention of a gate insulting film 710, which is so formed as to encircle the transistor pillar 705 in the same manner as the gate electrode 711a does. On the upper end of the transistor pillar 705, an upper diffusion layer 716 is formed as one of a source and a drain. On the lower end of the transistor pillar 705, lower diffusion layers 709 are formed as the other of the source and the drain. The lower diffusion layers 709 are insulated from the gate electrode 711a via insulating layers 708. In the vertical transistor of this configuration, a channel region is formed between the lower end and the upper end of the transistor pillar 705.

As shown in FIG. 17, a dummy pillar 706 is disposed adjacent to the transistor pillar 705. The dummy pillar 706 includes a dummy silicon pillar 706B and a dummy insulator pillar 706A. On the side wall of the dummy pillar 706, a gate electrode 711*b* is so formed as to encircle the dummy pillar 706. The gate electrode 711*b* is electrically and physically coupled to the gate electrode 711*a*. Signals, therefore, can be supplied to the gate electrode 711*a* via the gate electrode 711*b*.

On the element isolation region 702 and the dummy pillar 706, an insulating film 703 and a mask film 704 are formed. On the periphery of the gate electrodes 711*a* and 711*b*, a first inter-layer insulating film 712 is formed. On the mask film 704 and the first inter-layer insulating film 712, a second inter-layer insulating film 720 is formed.

A signal line 742 formed on the upper surface of the second inter-layer insulating film 720 is coupled to the signal line X8 of FIG. 16, and is coupled to the gate electrode 711*b* via a contact 741. A power line 733 formed on the upper surface of the second inter-layer insulating film 720 is coupled to the power line VDD of FIG. 16, and is coupled to a silicon plug 719 via a contact 730. The silicon plug 719 is coupled to the upper diffusion layer 716. On the side surface of the silicon plug 719, a side wall film 718 and an insulating film 717 are disposed, so that the silicon plug 719 is insulated from the gate electrode 711*a* via the side wall film 718 and insulating film 717.

A signal line 734 formed on the upper surface of the second inter-layer insulating film 720 is coupled to the signal line OUT of FIG. 16, and is coupled to the lower diffusion layer 709 via a contact 735.

The vertical transistor VTr0 is structured in the above manner. The other vertical transistors VTr1 to VTr14 are virtually identical in configuration with the vertical transistor VTr0. It is preferable that the vertical transistors VTr0 to VTr14 be virtually identical with each other in the widths of the pillar transistors 705, that is, in their sectional areas along a cut plane parallel with the surface of the silicon substrate 701. As shown in FIGS. 16 and 18, vertical transistors VTrn and VTrn+1 adjacent to each other may share one of the lower diffusion layers.

FIG. 16 is referred to again. In FIG. 16, eight vertical transistors VTr0, VTr2, VTr4, VTr6, VTr8, VTr10, VTr12, and VTr14 are included in the transistor group TrGP4, four vertical transistors VTr1, VTr5, VTr8, and VTr13 are included in the transistor group TrGP3, two vertical transistors VTr3 and VTr11 are included in the transistor group TrGP2, and a transistor VTr7 is included in the transistor group TrGP1.

As shown in FIG. 16, the gate electrodes of the vertical transistors VTr0, VTr2, VTr4, VTr6, VTr8, VTr10, VTr12, and VTr14 are all coupled to the signal line X8 through which the selection signal 143P4 is transmitted. Likewise, the gate electrodes of the vertical transistors VTr1, VTr5, VTr8, and VTr13 are all coupled to the signal line X4 through which the selection signal 143P3 is transmitted, the gate electrodes of the vertical transistors VTr3 and VTr11 are all coupled to the signal line X2 through which the selection signal 143P2 is transmitted, and the gate electrode of the vertical transistor Vtr7 is coupled to the signal line X1 through which the selection signal 143P1 is transmitted.

In this manner, when vertical transistors are used as output PMOS transistors, the transistors can be arranged by the same method as described in the first embodiment, and therefore the same effect is achieved. As in the above case of providing the output PMOS transistors as the vertical transistors, multiple output NMOS transistors are provided as vertical transistors, in which case the output NMOS transistors are laid out by the same method and the effect virtually the same as the effect achieved in the case of the PMOS transistors can be achieved.

Preferred embodiments of the present invention have been described above. The present invention is not limited to the above embodiments and may be modified into various forms on the condition that the modification does not deviate from the substance of the present invention. It is obvious that such modifications are also included in the scope of the invention.

While the case of applying the present invention to a DRAM is described in the above embodiments, the present invention is not limited to this case. The present invention may be applied also to various semiconductor memories each having an output circuit including a parallel circuit composed of multiple transistors, such as SRAM, PRAM, ReRAM, MRAM, FeRAM, NAND-type flash memory, and NOR-type flash memory. The present invention is applied also to semiconductor devices other than semiconductor memories, such as logic IC, CPU, MPU, and ASIC.

What is claimed is:

1. An apparatus comprising:
   an output circuit including first, second and third transistors, the first transistor including first and second diffusion layers, the third transistor including third and fourth diffusion layers, the first transistor sharing the second diffusion layer with the second transistor, the third transistor sharing the third diffusion layer with the second transistor, the second transistor configured to be conductive responsive to an active first signal and to be non-conductive responsive to an inactive first signal, and the first and third transistors configured to be conductive responsive to an active second signal that is different from the first signal and to be non-conductive responsive to an inactive second signal.

2. The apparatus as claimed in claim 1, further comprising an output terminal coupled to the first and third diffusion layers.

3. The apparatus as claimed in claim 1, wherein the output circuit further comprises fourth and fifth transistors, the fifth transistor includes a fifth diffusion layer and a sixth diffusion layer, the third transistor shares the fourth diffusion layer with the fourth transistor, the fifth transistor shares the fifth diffusion layer with the fourth transistor, the fourth transistor configured to be conductive responsive to an active third signal that is different from the first and second signals and to be non-conductive responsive to an inactive third signal, the fifth transistor configured to be conductive responsive to the active second signal and to be non-conductive responsive to the inactive second signal.

4. The apparatus as claimed in claim 3, further comprising an output terminal coupled to the first, third and fifth diffusion layers.

5. An apparatus comprising:
   a semiconductor substrate;
   first, second, third and fourth diffusion layers formed in the semiconductor substrate and arranged in line in a first direction, a first channel region defined between the first and second diffusion layers, a second channel region defined between the second and third diffusion layers and a third channel region defined between the third and fourth diffusion layers; and
   first, second and third gate electrodes formed respectively above the first, second and third channel regions, the second gate electrode configured to receive a first signal and the first and third gate electrodes configured to receive in common a second signal that is different from the first signal.

6. The apparatus as claimed in claim 5, further comprising an output terminal coupled in common to the first and third diffusion layers.

7. The apparatus as claimed in claim 6, further comprising an ESD circuit coupled in common to the first and third diffusion layers at one end thereof and coupled to the output terminal at the other end thereof.

8. The apparatus as claimed in claim 5, wherein the second and fourth diffusion layers are configured to receive in common a power supply voltage.

9. The apparatus as claimed in claim 8, further comprising a power supply line elongated in the first direction and configured to convey the power supply voltage in common to the second and fourth diffusion layers.

10. The apparatus as claimed in claim 5, wherein the first, second and third channel regions are substantially equal in length in the first direction to one another.

11. The apparatus as claimed in claim 5, wherein the first, second and third channel regions are substantially equal in width in a second direction, the second direction perpendicular to the first direction.

12. The apparatus as claimed in claim 5, further comprising:
 a calibration circuit configured to produce calibration information;
 a memory cell array configured to produce data; and
 a control circuit configured to receive the calibration information and the data and produce the first and second signals.

13. An apparatus comprising:
a semiconductor substrate;
first, second, third, fourth, fifth and sixth diffusion layers formed in the semiconductor substrate and arranged in line in a first direction, a first channel region defined between the first and second diffusion layers, a second channel region defined between the second and third diffusion layers, a third channel region defined between the third and fourth diffusion layers, a fourth channel region defined between the fourth and fifth diffusion layers and a fifth channel region defined between the fifth and sixth diffusion layers; and
first, second, third, fourth and fifth gate electrodes formed respectively above the first, second, third, fourth and fifth channel regions, the second gate electrode configured to receive a first signal, the fourth gate electrode configured to receive a second signal and the first, third and fifth electrodes configured to receive in common a third signal.

14. The apparatus as claimed in claim 13, further comprising an output terminal coupled in common to the first, third and fifth diffusion layers.

15. The apparatus as claimed in claim 14, further comprising an ESD circuit coupled in common to the first, third and fifth diffusion layers at one end thereof and coupled to the output terminal at the other end thereof.

16. The apparatus as claimed in claim 13, wherein the second, fourth and sixth diffusion layers are configured to receive in common a power supply voltage.

17. The apparatus as claimed in claim 16, further comprising a power supply line elongated in the first direction and configured to supply the power supply voltage in common to the second, fourth and sixth diffusion layers.

18. The apparatus as claimed in claim 13, wherein the first, second, third, fourth and fifth channel regions are substantially equal in length in the first direction to one another.

19. The apparatus as claimed in claim 13, wherein the first, second, third, fourth and fifth channel regions are substantially equal in width in a second direction, the second direction perpendicular to the first direction.

20. The apparatus as claimed in claim 13, further comprising:
 a calibration circuit configured to produce calibration information;
 a memory cell array configured to produce data; and
 a control circuit configured to receive the calibration information and the data and produce the first, second and third signals.

* * * * *